(12) United States Patent
Taherion et al.

(10) Patent No.: US 11,378,701 B2
(45) Date of Patent: Jul. 5, 2022

(54) LOW DARK CURRENT RADIATION DETECTOR AND METHOD OF MAKING THE SAME

(71) Applicant: REDLEN TECHNOLOGIES, INC., Saanichton (CA)

(72) Inventors: Saeid Taherion, Victoria (CA); Michael K. Jackson, Victoria (CA)

(73) Assignee: REDLEN TECHNOLOGIES, INC., Saanichton (CA)

( * ) Notice: Subject to any disclaimer, the term of this patent is extended or adjusted under 35 U.S.C. 154(b) by 0 days.

(21) Appl. No.: 17/064,089

(22) Filed: Oct. 6, 2020

(65) Prior Publication Data

US 2022/0107431 A1    Apr. 7, 2022

Related U.S. Application Data

(60) Provisional application No. 62/912,106, filed on Oct. 8, 2019.

(51) Int. Cl.
| | |
|---|---|
| *G01T 1/24* | (2006.01) |
| *H01L 27/146* | (2006.01) |
| *H01L 31/09* | (2006.01) |
| *G01T 1/17* | (2006.01) |

(52) U.S. Cl.
CPC .......... *G01T 1/24* (2013.01); *H01L 27/14658* (2013.01); *G01T 1/17* (2013.01); *H01L 31/09* (2013.01)

(58) Field of Classification Search
CPC .............................. G01T 1/24; H01L 27/14658
See application file for complete search history.

(56) References Cited

U.S. PATENT DOCUMENTS

| | | |
|---|---|---|
| 5,905,264 A | 5/1999 | Shahar et al. |
| 6,043,106 A | 3/2000 | Mescher et al. |
| 6,046,068 A | 4/2000 | Orava et al. |
| 6,168,967 B1 | 1/2001 | Hoffbauer et al. |
| 6,188,089 B1 | 2/2001 | Spartiotis |
| 6,215,123 B1 | 4/2001 | Orava et al. |
| 6,410,922 B1 | 6/2002 | Spartiotis et al. |
| 7,589,324 B2 | 9/2009 | Chen et al. |
| 7,955,992 B2 | 6/2011 | Chen et al. |
| 8,093,094 B2 | 1/2012 | Stahle et al. |
| 8,314,395 B2 | 11/2012 | Zhang et al. |
| 8,476,101 B2 | 7/2013 | Chen et al. |
| 8,492,728 B2 | 7/2013 | Antonuk |
| 8,614,423 B2 | 12/2013 | Chen et al. |
| 9,202,961 B2 | 12/2015 | Chen et al. |
| 9,847,369 B2 | 12/2017 | El-Hanany et al. |
| 10,203,420 B2 | 2/2019 | Lu et al. |
| 10,276,627 B2 | 4/2019 | El-Hanany et al. |

(Continued)

OTHER PUBLICATIONS

Bolotnikov et al., "Charge Loss Between Contacts of CdZnTe Pixel Detectors", Nucl. Instr. and Meth. A, (1999), 432, 326-331.

(Continued)

*Primary Examiner* — Hugh Maupin
(74) *Attorney, Agent, or Firm* — The Marbury Law Group PLLC (57) ABSTRACT

A radiation sensor includes a radiation-sensitive semiconductor layer, a cathode electrode disposed over a front side of the radiation-sensitive semiconductor layer that is configured to be exposed to radiation, at least one anode electrode disposed over a backside of the radiation-sensitive semiconductor layer, and a potential barrier layer located between the cathode electrode and the front side of the radiation-sensitive semiconductor layer.

14 Claims, 7 Drawing Sheets

(56) References Cited

U.S. PATENT DOCUMENTS

| | | | |
|---|---|---|---|
| 2007/0158574 A1* | 7/2007 | Petrillo | H01M 10/425 |
| | | | 250/370.13 |
| 2013/0012699 A1 | 5/2013 | Rusian et al. | |
| 2013/0126999 A1* | 5/2013 | Rusian | H01L 31/085 |
| | | | 257/428 |
| 2016/0240584 A1 | 8/2016 | El-Hanany et al. | |
| 2017/0170347 A1* | 6/2017 | Miura | H01L 31/0304 |
| 2017/0323922 A1* | 11/2017 | Cao | H01L 27/14696 |
| 2018/0033822 A1 | 2/2018 | El-Hanany et al. | |
| 2018/0122977 A1* | 5/2018 | Voss | H01L 31/02966 |
| 2018/0329079 A1 | 11/2018 | Lu et al. | |

OTHER PUBLICATIONS

Chen et al., "Passivation of CdZnTe surfaces by oxidation in low energy atomic oxygen", J. Vac. Sci. Technol. A, 1999, 17(1), 97-101.

Mescher et al., "Development of Dry Processing Techniques for CdZnTe Surface Passivation", Journal of Electronic Material, 1999, 28, 700-704.

Nemirovski et al., "Plasma anodization of Hg1-xCdxTe", Appl. Phys. Lett., 1980, 37(9), 813-815.

Prettyman et al., "Performance of CdZnTe detectors passivated with energetic oxygen atoms, Nuclear Instruments and Methods in Physics Research A", 1999, 422, 179-184.

Stahle et al., "Fabrication of CdZnTe strip detectors for large area arrays", Proc. SPIE Hard X-Ray and Gamma-Ray Detector Physics, Optics, and Applications, 1997, 3115, 90-97.

International Search Report and Written Opinion for PCT/IB2016/050552, dated Apr. 1, 2016, 9 pages.

International Preliminary Report on Patentability for International Patent Application No. PCT/IB2016/050552, dated Aug. 31, 2017, 7 pages.

* cited by examiner

LOW DARK CURRENT RADIATION DETECTOR AND METHOD OF MAKING THE SAME

FIELD

The present application is directed to the field of radiation detectors, and specifically to a low-dark-current radiation detector for ionizing radiation such as photons (X-rays and/or gamma rays) and ionizing particles (such as electrons, protons and/or neutrons), and methods of making the same.

BACKGROUND

High-energy detectors for detecting ionizing radiation can include a semiconductor material as a radiation-sensitive detector material within a radiation sensor. The semiconductor material generates an electron-hole-pair cloud when a high-energy photon or particle impinges thereupon. A bias voltage applied across an anode and a cathode induces electrons from the electron cloud to drift toward the anode, and holes toward the cathode, thereby generating detection current.

Radiation detectors detect presence of radiation by the electrical current generated by a radiation sensor. However, semiconductor materials of such sensors spontaneously generate electron-hole pairs due to thermal excitation. When biased, shot noise, generation-recombination noise and 1/f noise are generated due to the flow of current through the sensor. Thus, a radiation detector has an inherent noise signal generated by the spontaneous electron-hole pair generation and current flow. The electrical current generated by flow of electrons and/or holes flows through radiation sensors even when the radiation detectors are not subjected to any electromagnetic radiation, i.e., when the radiation detectors are placed in the dark. Such electrical current is commonly referred to as dark current or reverse bias leakage current.

Dark current is a major source of undesirable noise in radiation detectors. Dark current also compromises the performance of readout electronics used to detect the output of radiation sensors used in radiation detectors. Dark current is generally temperature dependent, and increases rapidly within an increase in absolute temperature. The adverse impact of the dark current is even more significant in case the radiation detector is operated at elevated temperatures. Prior-art semiconductor radiation detectors typically have a maximum operable temperature of about 35 degrees Celsius due to the high level of dark current. In case operation at a higher temperature is required, prior-art radiation detectors employed active temperature control elements, such as thermoelectric coolers, which add to cost and weight of prior-art radiation detectors, and reduce reliability of the prior art radiation detectors.

SUMMARY

According to one embodiment of the present disclosure, a radiation sensor includes a radiation-sensitive semiconductor layer, a cathode electrode disposed over a front side of the radiation-sensitive semiconductor layer that is configured to be exposed to radiation, at least one anode electrode disposed over a backside of the radiation-sensitive semiconductor layer, and a potential-barrier layer located between the cathode electrode and the front side of the radiation-sensitive semiconductor layer.

According to another aspect of the present disclosure, a method of forming a radiation sensor includes forming a potential-barrier layer on a front side of a radiation-sensitive semiconductor layer, forming a cathode electrode over the potential-barrier layer, and forming at least one anode electrode on a backside of the radiation-sensitive semiconductor layer.

DETAILED DESCRIPTION

As discussed above, the embodiments of the present disclosure are directed to a low-dark-current radiation detector and methods of making the same, the various aspects of which are described herein in detail.

Referring to FIGS. 1-6, various configurations of a radiation detector 1000 according to embodiments of the present disclosure are illustrated. The radiation detector 1000 includes a sensor unit 100 configured to detect incoming radiation and to generate electrical current passing through a respective channel. Further, the radiation detector 1000 includes a signal processing unit 200, which may include an array of pixel detector circuits 120.

The sensor unit 100 includes a radiation-sensitive semiconductor material layer 30, a cathode electrode 10 located over a front side of the radiation-sensitive semiconductor material layer 30 that faces a radiation source, and at least one anode 40 located on a backside of the radiation-sensitive semiconductor material layer 30. The radiation-sensitive semiconductor material layer 30 includes any suitable radiation-sensitive semiconductor material. As used herein, a "radiation-sensitive semiconductor material" refers to a semiconductor material that generates charge carriers, such as electron-hole pairs, in response to high-energy photons or particles. The radiation-sensitive semiconductor material layer 30 can include semiconductor material such as cadmium zinc telluride (CZT), cadmium telluride, gallium arsenide, silicon, silicon-germanium, or another semiconductor material that can generate charge carriers, such as electrons and holes, when exposed to high-energy radiation. In one embodiment, the radiation-sensitive semiconductor material layer 30 can include at least a portion of a cadmium zinc telluride wafer. The radiation-sensitive semiconductor material layer 30 can include a single-crystalline semiconductor material.

In some embodiments, the radiation detector 1000 of the present disclosure can include a flat sensor 100 shown in FIGS. 1 through 6 having a thickness in a range from 5 mm to 15 mm, although a thinner sensor or a thicker sensor can also be employed. The thickness of the radiation-sensitive semiconductor layer 300 can be selected to provide enough stopping power for the highest-energy photons to be detected. The radiation-sensitive semiconductor material layer 30 generates a cloud of charge carriers, such as electrons and holes when a high energy photon or particle, impinges thereupon.

Figure 1:
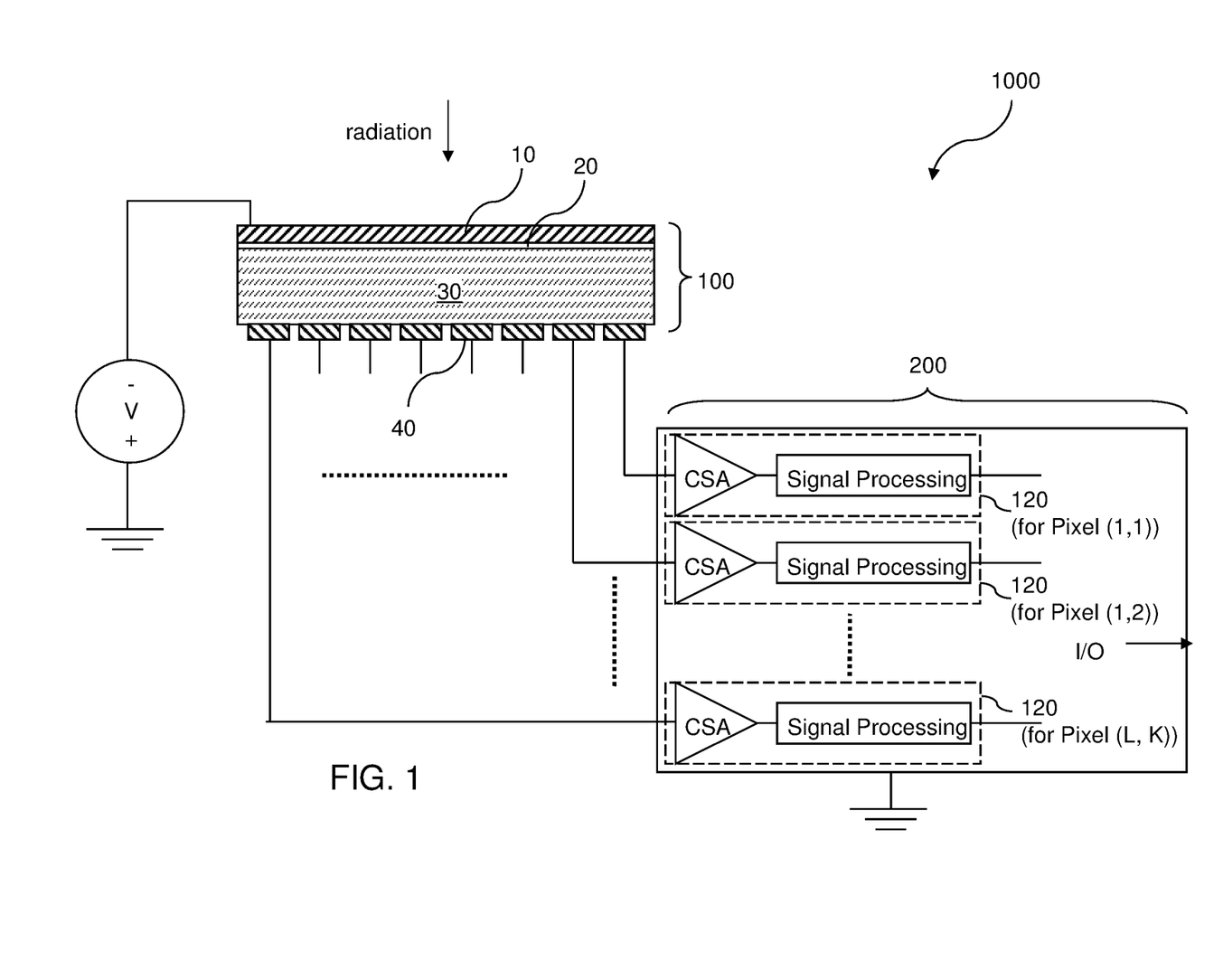
FIG. 1 is a schematic view of a first exemplary radiation detector according to an embodiment of the present disclosure.

In one embodiment, the radiation detector 1000 is configured as an imaging detector that can map the spatial distribution of the impinging photons by tracking the positions of the photons with a spatial resolution that is on the order of the pitch of anode electrodes 40 as illustrated in FIG. 1. Such an imaging detector typically includes a directional device such as an antiscatter grid, which limits the range of directions from which incident photons may strike the sensor. A plurality of anode electrodes 40 may be arranged in an array configuration, and the signal processing unit 200 can include an array of pixel detector circuits 120 that are electrically connected to a respective anode electrode 40 of the plurality of anode electrodes 40. The anode electrodes 40 function as an array of metallic contacts located on the backside of the radiation-sensitive semiconductor material layer 30. Each of the anode electrodes 40 may have a shape of a square or a rectangle and may be associated with one pixel or subpixel of the sensor 100. In one embodiment, an array of anode electrodes 40 can be arranged as a L×K rectangular array of pixels or subpixels in which L and K are integers greater than 1. For example, the integer L can be in a range from 2 to 1,024 such as from 8 to 256, and the integer K can be in a range from 2 to 1,024 such as from 7 to 256, although greater numbers may be employed for each of L and K.

Figure 2:
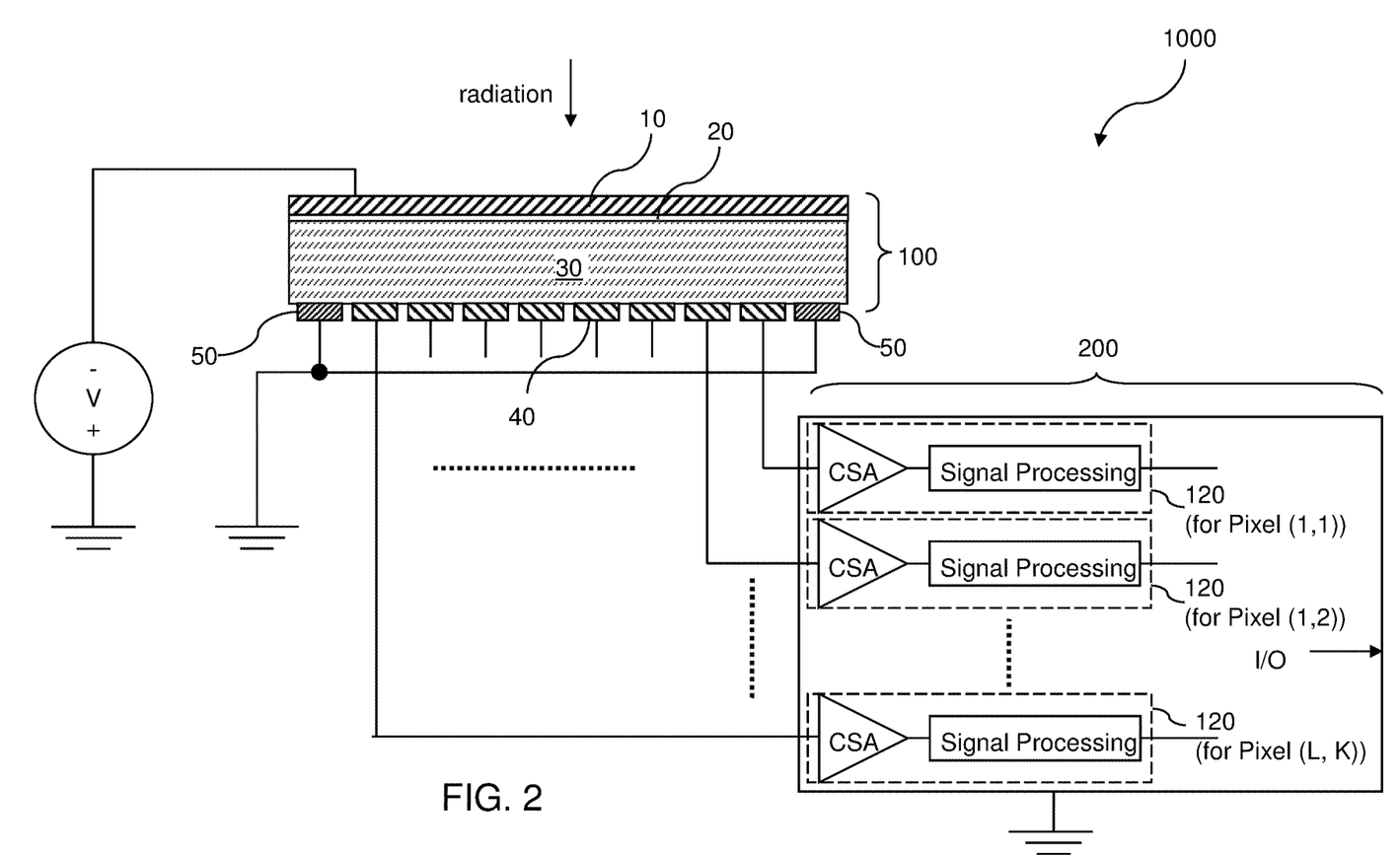
FIG. 2 is a schematic view of a second exemplary radiation detector according to an embodiment of the present disclosure.
Figure 3:
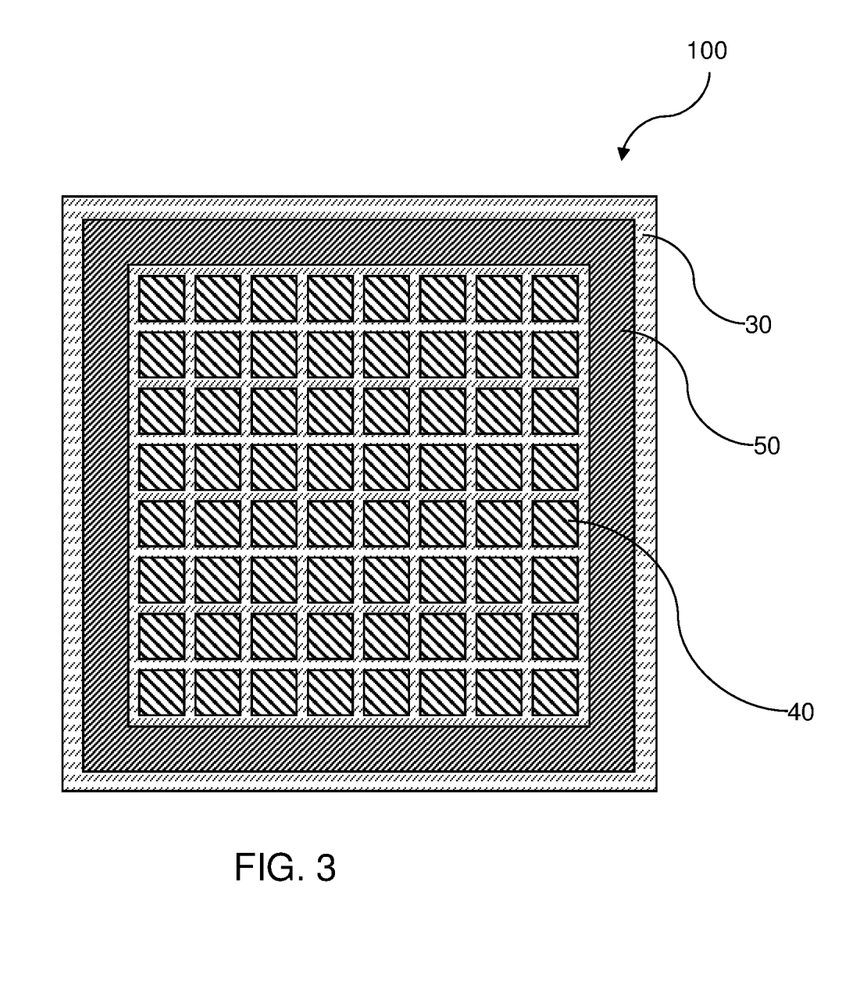
FIG. 3 is a schematic view of the backside metallization of an embodiment of the present disclosure.

Alternatively, to reduce the impact of leakage current flowing from anode electrodes, along the surface of the radiation-sensitive semiconductor material layer 30, to the cathode electrode 10, a guard-ring electrode 50 can be formed surrounding the anode electrodes, and connected to ground as shown in FIG. 2. Alternatively the guard ring may be connected to a fixed bias source that is less than the bias applied for the cathode, often in the neighbourhood of a few percent of the high voltage bias level. Typically, the guard-ring electrode 50 forms one continuous electrode around the perimeter of the anode pixels as shown in FIG. 3. Alternatively, the guard-ring electrode may be broken in one or more places, and each portion of the electrode connected to the same fixed bias source or ground.

Figure 4:
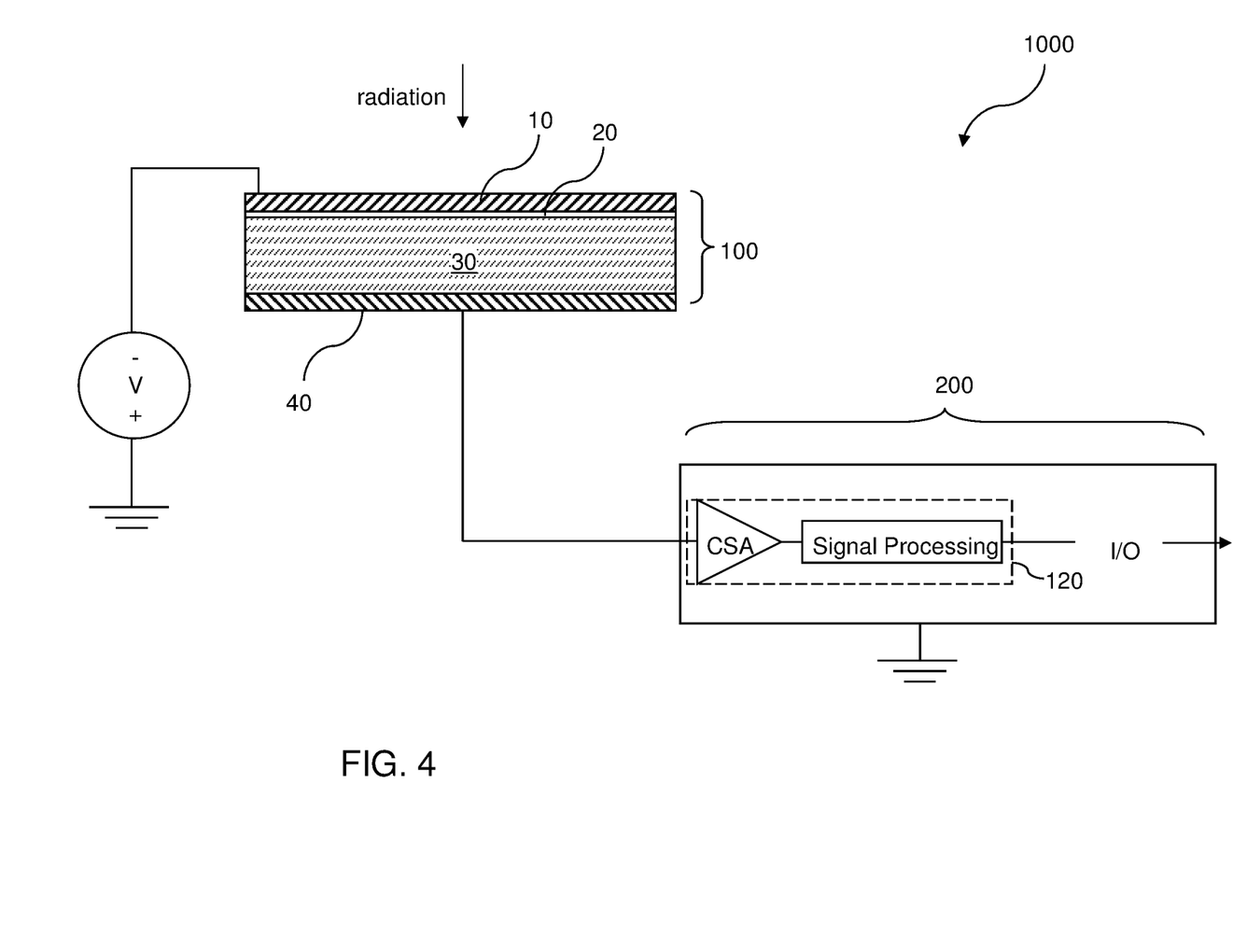
FIG. 4 is a schematic view of a third exemplary radiation detector according to an embodiment of the present disclosure.
Figure 5:
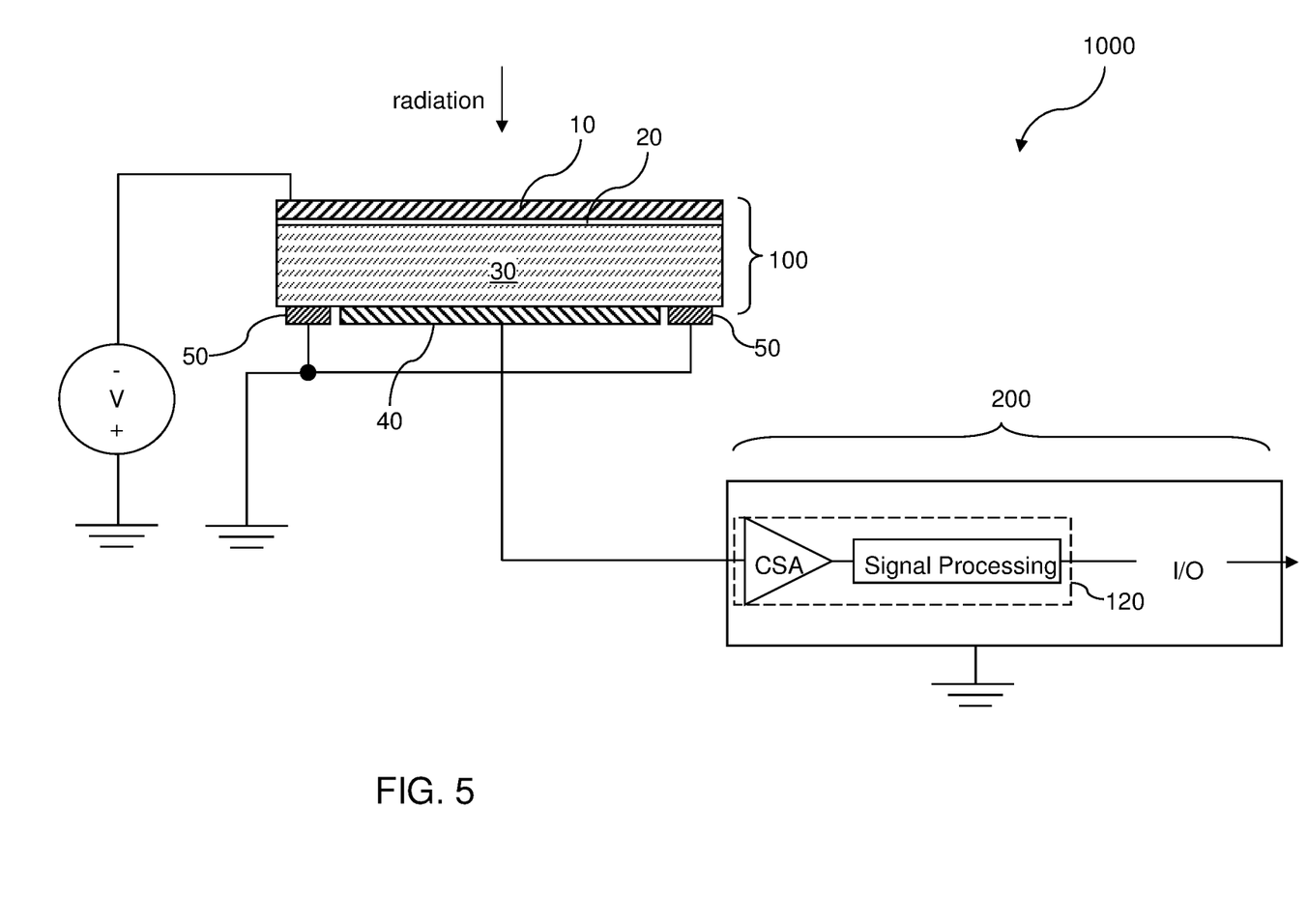
FIG. 5 is a schematic view of a fourth exemplary radiation detector according to an embodiment of the present disclosure.
Figure 6:
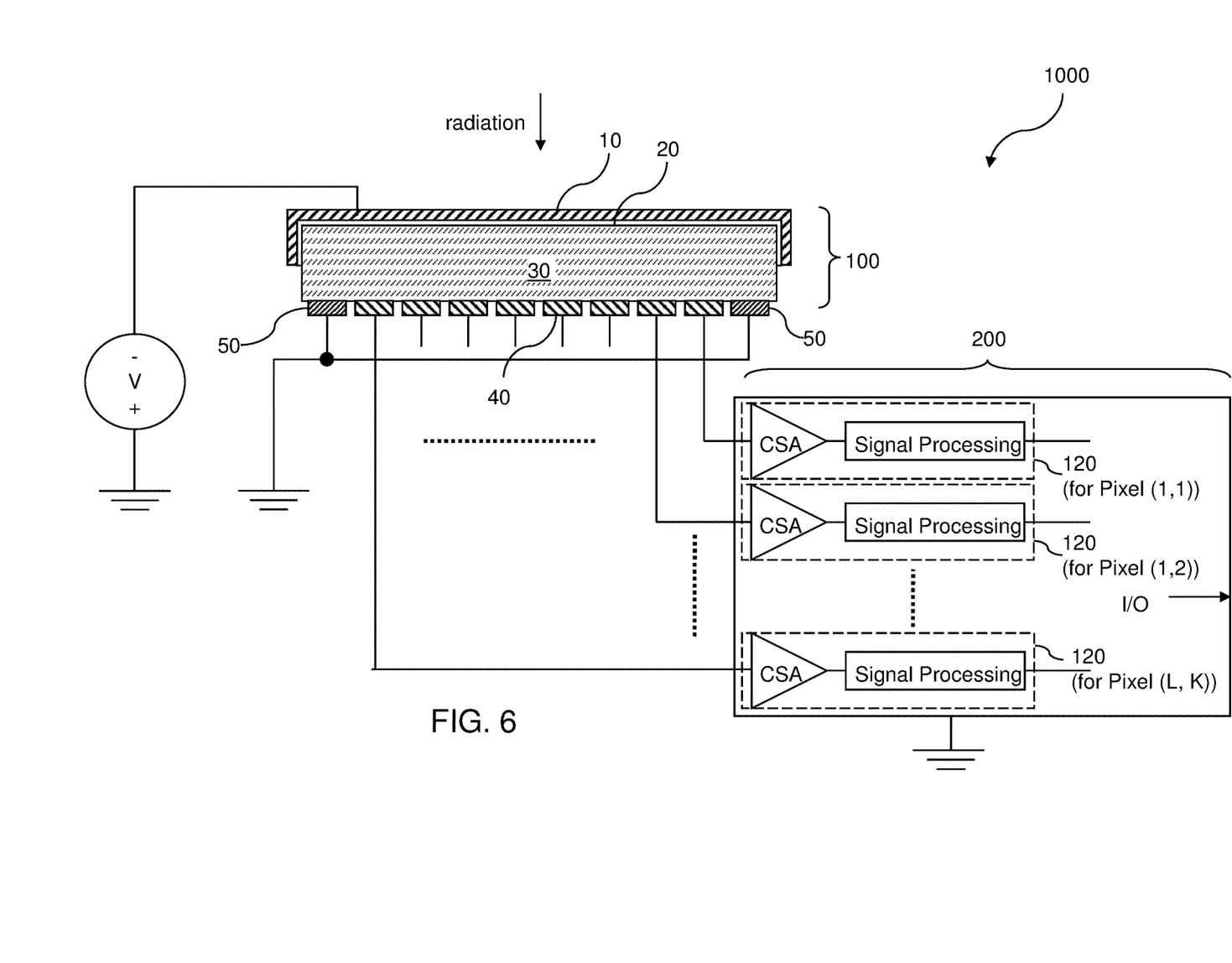
FIG. 6 is a schematic view of a fifth exemplary radiation detector according to an embodiment of the present disclosure.

Alternatively, a single anode electrode 40 for a single-pixel detector can be employed in lieu of an array of anode electrodes 40 for a radiation detector as illustrated in FIG. 4, or as illustrated in FIG. 5 with a guard-ring electrode. Additionally or alternatively, as shown in FIG. 6, the radiation detector 1000 of the embodiments of the present disclosure may have the cathode electrode disposed on the front side and a portion of the sidewalls of the radiation-sensitive semiconductor material layer 30.

The metallic contacts which comprise the anode electrodes 40 can be electrically connected to respective input channels of the signal processing unit 200, which may be implemented as an application-specific integrated chip (ASIC). The cathode electrode 10 may comprise a metallic (i.e., electrically conductive metal or metal alloy) contact structure that overlies the entire front surface, or substantially the entire front surface, of the radiation-sensitive semiconductor material layer 30, or may comprise a plurality of metal contact structures. The radiation-sensitive semiconductor material layer 30 may comprise an n-type semiconductor material, such as n-type CZT, and a negative bias voltage in a range from −500 V to −5,000 V can be applied to the cathode electrode 10, although a larger or a smaller negative bias may be used. The signal processing unit 200 can maintain the voltages at the anode electrodes 40 at a voltage close to zero volts, such as a voltage with a magnitude less than 1 V. The electric field across the radiation-sensitive semiconductor material layer 30 causes radiation-generated charge carriers (e.g., electrons and holes) to move along, or against, the direction of the electrical field, depending on their charge. The electrons move towards the anode electrodes 40, and the holes move toward the cathode electrode 10.

The radiation-sensitive semiconductor layer 30 generates a significant number of pairs of electrons and holes within a relatively small volume when an incoming high-energy photon or particle is absorbed. The electrons typically move toward the anode electrodes 40 with a higher mobility than the holes move toward the cathode electrode 10. The lateral dimensions of the anode pixels 40 can be less than the thickness of the radiation-sensitive semiconductor layer 30, and a short current pulse is induced in an anode electrode 40 and is detected by the signal processing unit 200. The radiation detector 1000 can estimate the total amount of the generated electron charge by integrating the current through the anode electrode 40, and thereby estimate the energy of the incoming high-energy radiation.

In the absence of incoming radiation, thermal generation of electron-hole pairs in the radiation-sensitive semiconductor layer 30 and/or current injection from the cathode electrode 10 and the anode electrodes 40 result in dark current, which flows into the anode electrodes 40 and is detected by the pixel detector circuits 120. The dark current can lead to random errors in the charge estimation. Reduction in the dark current can improve the accuracy of the estimation the radiation-generated electrical charge carriers, and thus, estimation of the energy of the detected radiation. Thus, reduction in the dark current enhances energy resolution of the radiation detector 1000. In addition, a high level of dark current can make the design of the pixel detector circuits 120 very challenging. One of the performance metrics for the pixel detector circuits 120 is the level of the dark current that the ASIC design can handle. One specification for the ASIC is the value of the dark current that the pixel detector circuits 120 can handle per channel, i.e., the maximum dark current that each pixel detector circuit 120 can handle. It is easier to design a pixel detector circuit 120 having a low maximum allowable dark current than to design a pixel detector circuit 120 having a high maximum allowable dark current. In other words, if a pixel detector circuit 120 is allowed to have low maximum allowable dark current, other performance characteristics of the pixel detector circuit 120 such as charge estimation accuracy may be improved and/or the cost of the pixel detector circuit 120 may be reduced.

According to an aspect of the present disclosure, a potential-barrier layer 20 is provided between the radiation-sensitive semiconductor layer 30 and the cathode electrode 10 to reduce the magnitude of the dark current and to reduce the temperature dependence of the dark current. The reduction of the dark current through use of the potential-barrier layer 20 allows the radiation detector 1000 of the embodiments of the present disclosure to be used at higher operational temperatures, and provides enhanced energy resolution.

The radiation detector 1000 of the embodiments of the present disclosure can be incorporated as a component of a radiation detection system. Such a radiation detector system including at least one radiation detector 1000 of the embodiments of the present disclosure may not require any cooling system or an energy supply system for powering the cooling system. Thus, a radiation detector system including at least one radiation detector 1000 of the embodiments of the present disclosure can provide reduced weight, reduced cost, simpler structure and higher reliability by removing the requirement for a cooling system. For example, a radiation detector system including at least one radiation detector 1000 of the embodiments of the present disclosure can be operable a temperature of at least 70° C., and may be operable at a temperature of 100° C. or above. Alternatively, a radiation detector system including at least one radiation detector 1000 of the embodiments of the present disclosure can reduce the requirements for a cooling system, decreasing its weight, cost and improving reliability compared to prior-art systems.

According to a first embodiment of the present disclosure, the potential-barrier layer 20 can include a dielectric material layer having a thickness that allows flow of electrical current by tunneling of electrical charge carriers (such as holes and/or electrons) therethrough and/or a potential barrier height sufficiently low to allow thermionic emission of electrons or holes thereover. In one embodiment, the potential-barrier layer 20 may include a dielectric oxide of the semiconductor material of the radiation-sensitive semiconductor layer 30 that is formed by surface oxidation induced by performing a plasma oxidation process.

The semiconductor material of the radiation-sensitive semiconductor layer 30 can include an n-type, p-type, or intrinsic semiconductor material. In one embodiment, the semiconductor material of the radiation-sensitive semiconductor layer 30 can have an n-type conductivity. In one embodiment, the n-type semiconductor material of the radiation-sensitive semiconductor layer 30 can have a stoichiometric composition or a near-stoichiometric composition. In one embodiment, the semiconductor material of the radiation-sensitive semiconductor layer 30 can comprise, and/or consist essentially of, an n-type cadmium zinc telluride material in which the (Zn+Cd)/Te ratio is 1.0 or in a range from 0.999 to 1.001.

In one embodiment, the n-type semiconductor material of the radiation-sensitive semiconductor layer 30 can comprise, and/or consist essentially of, an n-type cadmium zinc telluride material in which the Zn/(Zn+Cd) ratio, i.e., the ratio of the atomic concentration of zinc atoms to the sum of the atomic concentration of zinc atoms and the atomic concentration of the cadmium atoms, is in range from 0.02 to 0.20, such as 0.09 to 0.11, such as 0.1. In other words, the radiation-sensitive semiconductor layer 30 can comprise, and/or consist essentially of, $Cd_{1-x}Zn_xTe$ in which x is in range from 0.02 to 0.20, such as 0.09 to 0.11, such as about 0.1.

In one embodiment, a front surface (i.e., the cathode facing surface) of the radiation-sensitive semiconductor layer 30 can be planarized prior to a step that forms the potential-barrier layer 20 by polishing and/or etching the semiconductor material of the radiation-sensitive semiconductor layer 30. The material composition of a surface portion of the radiation-sensitive semiconductor layer 30 that is physically exposed after the planarization process can be the same as the material composition of a bulk portion of the radiation-sensitive semiconductor layer 30 that is not physically exposed, or it may have a non-stoichiometric composition, e.g. a tellurium-rich composition.

An aspect of the first embodiment where the radiation-sensitive semiconductor layer 30 comprises and/or consists essentially of n-type cadmium zinc telluride, the dielectric oxide material of the potential-barrier layer 20 can include, and may consist essentially of, an oxide of cadmium zinc tellurium, such as an oxide of one or more of tellurium, cadmium and/or zinc. Generally, the potential-barrier layer 20 may be formed by converting a surface portion of the front side of the radiation-sensitive semiconductor layer 30 to a dielectric oxide of the semiconductor material. A plasma oxidation process may be used to convert the front surface of the radiation-sensitive semiconductor layer 30 into the potential-barrier layer 20. Alternatively, chemical oxidant, such as hydrogen peroxide, may be applied to the physically-exposed front surface of the semiconductor layer 30 to form the oxide potential-barrier layer 20 on the front surface. The duration of the oxidation process can be selected such that the dielectric oxide material of the potential-barrier layer 20 has a thickness that allows charge carrier transport therethrough or thereover. For example, the dielectric oxide of the potential-barrier layer 20 can have a thickness in a range from 1.0 nm to 10 nm, such as from 1.5 nm to 5 nm. In an alternative embodiment, rather than oxidizing the front surface, a nitridation of the front surface may be used instead to form a dielectric nitride of the semiconductor layer 30 on its front surface.

In an alternative embodiment, the potential-barrier layer 20 can be formed by deposition of a dielectric material layer directly on the front surface of the radiation-sensitive semiconductor layer 30. The front surface of the radiation-sensitive semiconductor layer 30 may, or may not, be planarized (e.g., polished and/or etched) prior to deposition of the potential-barrier layer.

The composition and the thickness of the dielectric material of the potential-barrier layer 20 can be selected such that tunneling current can pass through the potential-barrier layer 20. In other words, the potential-barrier layer 20 has a thickness that allows charge carrier tunneling therethrough. Alternatively, the dielectric material of the potential-barrier layer 20 can be selected such that thermionic emission current can pass over the potential-barrier layer 20. In one embodiment, the dielectric material of the potential-barrier layer 20 comprises a material selected from silicon oxide, aluminum oxide, aluminum nitride, or a dielectric oxide of a transition metal element (such as hafnium oxide, yttrium oxide, tantalum oxide, titanium oxide, etc.). In one embodiment, the thickness of the potential-barrier layer 20 can have a thickness in a range from 1.0 nm to 10 nm.

According to a second embodiment of the present disclosure, the potential-barrier layer 20 can include a barrier semiconductor material that forms a heterojunction with the material of the radiation-sensitive semiconductor layer 30. The material composition and the thickness of the barrier semiconductor material of the potential-barrier layer 20 can be selected such that current can pass through and/or over the barrier semiconductor material of the potential-barrier layer 20, while the barrier semiconductor material suppresses dark current flow. In general, the radiation-sensitive semiconductor layer 30 can include any radiation-sensitive semiconductor material such as cadmium zinc telluride, cadmium telluride, gallium arsenide, silicon, or silicon-germanium, and the barrier semiconductor material of the potential-barrier layer 20 can include zinc sulfide, manganese sulfide, magnesium sulfide, zinc selenide, magnesium selenide, cadmium selenide, magnesium telluride, manganese telluride, silicon, germanium, silicon germanium or other suitable barrier materials.

In one embodiment, the semiconductor material of the radiation-sensitive semiconductor layer 30 can include an n-type cadmium zinc telluride material. For example, the semiconductor material of the radiation-sensitive semiconductor layer 30 can include an n-type cadmium zinc telluride material in which a ratio of an atomic concentration of zinc atoms to a sum of the atomic concentration of zinc atoms and an atomic concentration of the cadmium atoms is in range from 0.02 to 0.20 (e.g., a composition of $Cd_{1-x}Zn_xTe$ in which x between 0.02 and 0.2, such as 0.1). The barrier semiconductor material of the potential-barrier layer 30 can include, and/or consist essentially of, zinc sulfide, silicon, germanium, silicon germanium or a cadmium zinc telluride material having a higher atomic concentration of zinc than the n-type cadmium zinc telluride material. For example, barrier semiconductor material of the potential-barrier layer 20 can have a composition of $Cd_{1-y}Zn_yTe$, in which y is greater than x, and in which y may range from 0.2 to 1.0, such as from 0.25 to 0.5. In one embodiment, the barrier semiconductor material of the potential-barrier layer 20 can include at least one non-oxygen element that is not present within the semiconductor material of the radiation-sensitive semiconductor layer 30. For example, the radiation-sensitive semiconductor layer 30 can include cadmium zinc telluride, and the potential-barrier layer 20 can include cadmium sulfide.

In one embodiment, the front surface of the radiation-sensitive semiconductor layer 30 can be planarized (e.g., polished and/or etched) prior to deposition of the potential-barrier layer 20, and the barrier semiconductor material of the potential-barrier layer 20 can be deposited by reactive sputtering, atomic layer deposition, molecular beam deposition, or other deposition methods. In one embodiment, the barrier semiconductor material of the potential-barrier layer 20 can have a thickness in a range from 1 nm to 100 nm, such as from 2 nm to 10 nm, although lesser and greater thicknesses can also be employed.

Generally, the potential-barrier layer 20 is formed on the front surface of the radiation-sensitive semiconductor layer 30. The potential-barrier layer 20 can include, and/or consist essentially of, a material selected from a dielectric or semiconductor material having a thickness that allows charge carrier tunneling therethrough or carrier thermionic emission thereover.

A cathode electrode 10 can be formed on the front surface of the potential-barrier layer 20 by depositing at least one metal or metal alloy. The at least one metal or alloy can be selected from metal elements that do not diffuse or migrate through the potential-barrier layer 20 into the radiation-sensitive semiconductor layer 30 because such diffusion of a metal element can change or destabilize the performance of the radiation sensor over time and/or under different operating conditions. Exemplary metallic elements that provide suitable electrical contact to the radiation-sensitive semiconductor layer 30 through the potential-barrier layer 20 include, but are not limited to, Pt, Ti, Cr, Au, etc.

At least one anode electrode 40 can be formed on the backside surface of the radiation-sensitive semiconductor layer 30. Various metallic contact structures may be employed for the at least one anode electrode 40. In one embodiment, Ohmic contacts (also known as non-blocking contacts) may be formed. Alternatively, blocking contacts employing a thin dielectric material layer at an interface with the backside surface of the radiation-sensitive semiconductor layer 30 may be employed to form each anode electrode 40. Alternatively, blocking contacts deposited directly on the backside surface of the radiation-sensitive semiconductor layer 30 may be employed to form each anode electrode 40. Without wishing to be bound by a particular theory, it is believed that the nature of the anode contact does not play an important role in controlling dark current as long as defects in the anode electrodes 40 can be avoided in order to prevent introduction of deleterious effects caused by defects in the anode electrodes 40, and the anode material is chosen so the work function is suitable for the semiconductor forming the radiation-sensitive semiconductor layer 30 to allow charge detection by the signal processing unit 200.

According to an aspect of the present disclosure, the potential-barrier layer 20 provides a potential barrier for charge carriers (e.g., at least one of electrons or holes) at the interface between the metal of the cathode electrode 10 and the semiconductor material of the radiation-sensitive semiconductor layer 30. The potential-barrier layer 20 allows flow of the electric current (i.e., charge carriers) therethrough or thereover after a high-energy photon or particle impinges on the sensor 100, but suppresses the dark current in the absence of high-energy radiation impingement on the sensor.

Surface cleaning of the front surface of the radiation-sensitive semiconductor layer 30 prior to formation of the potential-barrier layer 20 may reduce the defect density in the potential-barrier layer 20, thereby allowing optimal suppression of the dark current. Homogeneous composition of the radiation-sensitive semiconductor layer 30 in all regions, including the surface region that interfaces with the potential-barrier layer 20, may further assist in reduction of defects at, or near, the potential-barrier layer 20. The potential-barrier layer 20 functions as a current-blocking layer for the dark current, thereby reducing noise in signal processing unit 200.

Figure 7:
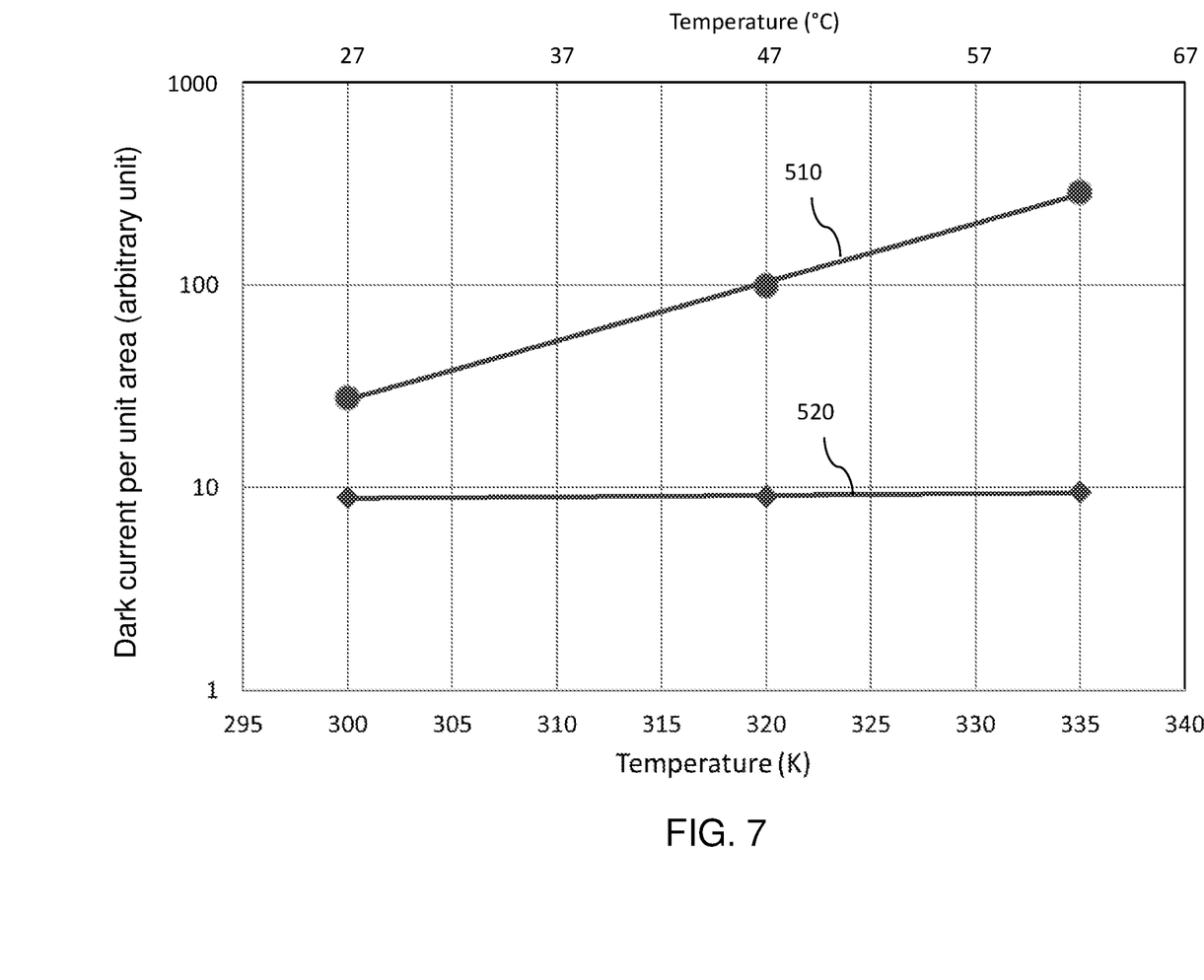
FIG. 7 illustrates temperature dependence of the dark current density for a radiation detector according to an embodiment of the present disclosure and the temperature dependence of the dark current density for a comparative exemplary radiation detector.

Referring to FIG. 7, a plot of current versus temperature for a sensor 100 according to an embodiment of the present disclosure, and for a comparative sensor that differs from the sensor of the embodiment of the present disclosure by absence of the potential-barrier layer 20. A first curve 510 is fitted to three measured data points from the comparative sensor, and a second curve 520 is fitted to three measured data points from the embodiment sensor 100 and the comparative sensor.

The comparative sensor includes a semiconductor layer 30 comprising n-type cadmium zinc telluride having a material composition of $Cd_{0.9}Zn_{0.1}Te$. The thickness of the radiation-sensitive semiconductor layer 30 is about 10 mm, the shape is a square shape with lateral dimensions of about 22 mm×22 mm. A gold cathode electrode 10 is located directly on the front surface of the semiconductor layer 30, and an 11×11 array of anode electrodes 40 is located on the backside of the semiconductor layer 30. Each pixel has a square shape with lateral dimensions of approximately 1.8 mm×1.8 mm. A gold guard ring electrode 50 is located directly on the front surface of the semiconductor layer 30 around the periphery of the front surface.

After the comparative sensor is tested to obtain the data for curve 510 of FIG. 7, the cathode electrode 10 is removed from the semiconductor layer 30, and an oxide of cadmium zinc telluride potential-barrier layer 20 formed by plasma oxidation of the CZT semiconductor layer 30. A gold cathode electrode 10 reformed on the potential-barrier layer 20. The embodiment sensor 100 is then tested to obtain the data for curve 520 in FIG. 7.

The total dark current is measured for all pixels, i.e., for the 121 pixels having a total area of 22 mm×22 mm, in absence of incoming photons for both sensors, at a negative bias of −1000V. Dark current per pixel is determined by dividing the total dark current by the number of pixels, i.e., by dividing by 121. The temperature of the sensors is changed between total dark current measurements to obtain the temperature dependence of the dark current.

The radiation detector 1000 containing the embodiment sensor exhibited dramatically improved dark current characteristics as a function of temperature compared to the detector containing the comparative sensor. Curve 510 illustrates the dark current as a function of temperature of the comparative radiation detector in which the cathode electrode is formed directly on the radiation-sensitive semiconductor layer. Curve 520 illustrates the dark current as a function of temperature of the embodiment sensor that includes the potential-barrier layer between the cathode electrode and the radiation-sensitive semiconductor layer. The vertical axis represents the dark current in arbitrary units on a log scale. The horizontal axis represents temperature, which is represented in degrees Kelvin in the lower scale and is represented in degrees Celsius in the upper scale. The circles on the curve 510 represent measured dark current at three temperatures for the comparative sensor, and the diamonds on the curve 520 represent measured dark current at three temperatures for the embodiment sensor.

The dark current for the comparative sensor represented by the curve 510 shows a significant increase with increasing temperature. Specifically, the dark current increases by a factor of 10 as the temperature increases from 300 K to 335 K. This corresponds to a rate of increase in the dark current per Kelvin of about $10^{(1/35)}$ per Kelvin, which is about 1.0680. In other words, the dark current for the comparative exemplary radiation detector increases by about 6.8% for every increase in temperature by 1 Kelvin.

In contrast, the dark current for the embodiment sensor 100 represented by the curve 520, provides not only reduction in the dark current at 300 K by a factor of about 3 compared to the curve 510, but also shows a significant decrease in slope. Thus, the rate of increase in the dark current as a function of temperature is less for the embodiment sensor 100 that includes the potential-barrier layer 20. Specifically, the dark current increases only by about 6% as the temperature increases from 300 K to 335 K for the embodiment sensor 100 that includes the potential-barrier layer 20. This corresponds to a rate of increase in the dark current per Kelvin of about $1.06^{(1/35)}$ per Kelvin, which is about 1.0017. In other words, the dark current for the radiation detector 1000 according to an embodiment of the present disclosure increases by about 0.2% for every increase in temperature by 1 Kelvin.

Generally, the sensor 100 containing the potential-barrier layer 20 can provide less than 50% increase in the dark current between 300K and 335K, which corresponds to a rate of increase in the dark current per degree Kelvin of about 1.2% per Kelvin or less. In one embodiment, the rate of increase in the dark current per degree Kelvin can be in a range from 0.1% per Kelvin to 1.2% per Kelvin in a temperature range from 300 K to 335 K, although higher and lower rates of increase in the rate of increase in the dark current per degree Kelvin are included in the scope of the present disclosure.

Generally, the radiation detector 1000 of embodiments of the present disclosure can display a very small increase with increasing temperature. In addition to reduced sensitivity of the dark current to ambient temperature, the radiation detector 1000 of embodiments of the present disclosure can provide less dark current in absolute scale. The dark current for embodiment sensor is less than the dark current for the comparative sensor without any potential-barrier layer by a factor of approximately 3, 11, and 30 at 300K, 320K, and 365 K, respectively.

The spectral performance the comparative and embodiment sensors is also tested using a Cs-137 source, which emits gamma rays at approximately 662 keV. The energy resolution (ER) is characterized by the full-width at half-maximum (FWHM) of the spectral peak for each pixel, averaged for all functioning pixels on the sensor. The average ER for both sensors is about the same. Thus, the impact of the presence of the potential-barrier layer 20 on the average ER is not detectable from these results.

Because the radiation detector 1000 according to embodiments of the present disclosure provides lower dark current density, the radiation detector 1000 of embodiments of the present disclosure can operate at a higher operating temperature, which may enable operation in high temperature environments.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A radiation sensor, comprising:
    a radiation-sensitive semiconductor layer;
    a cathode electrode disposed over a front side of the radiation-sensitive semiconductor layer that is configured to be exposed to radiation;
    at least one anode electrode disposed over a backside of the radiation-sensitive semiconductor layer; and
    a potential-barrier layer located between the cathode electrode and the front side of the radiation-sensitive semiconductor layer,
    wherein the radiation sensor has a dark current having a temperature dependence in which a rate of increase in the dark current per degree Kelvin is in a range from 0.1% per Kelvin to 1.2% per degree Kelvin in a temperature range from 300 K to 335 K.

2. The radiation sensor of claim 1, wherein the potential-barrier layer contacts both the cathode electrode and the front side of the radiation-sensitive semiconductor layer.

3. The radiation sensor of claim 1, wherein the radiation-sensitive semiconductor layer comprises n-type cadmium zinc telluride.

4. The radiation sensor of claim 3, wherein a ratio of an atomic concentration of zinc atoms to a sum of the atomic concentration of zinc atoms and an atomic concentration of the cadmium atoms is in range from 0.02 to 0.20 in the n-type cadmium zinc telluride.

5. The radiation sensor of claim 3, wherein the potential-barrier layer comprises a dielectric material having a thickness that allows charge carrier tunneling therethrough.

6. The radiation sensor of claim 5, wherein the dielectric material comprises an oxide of cadmium zinc telluride.

7. The radiation sensor of claim 5, wherein the dielectric material comprises a material selected from silicon oxide, aluminum oxide, aluminum nitride, or a dielectric oxide of a transition metal element.

8. The radiation sensor of claim 3, wherein the potential-barrier layer comprises a dielectric material having a barrier height that allows charge carrier thermionic emission thereover.

9. The radiation sensor of claim 3, wherein the potential-barrier layer comprises a barrier semiconductor layer.

10. The radiation sensor of claim 9, wherein the barrier semiconductor layer comprises zinc sulfide, manganese sulfide, magnesium sulfide, zinc selenide, magnesium selenide, cadmium selenide, magnesium telluride, manganese telluride, silicon, germanium, silicon germanium or cadmium zinc telluride having a wider bandgap than a bandgap of the radiation-sensitive semiconductor material layer.

11. A radiation detector, comprising:
the radiation sensor of claim 3; and
a signal processing unit including at least one pixel detector circuit that is electrically connected to the at least one anode electrode.

12. A method of operating the radiation detector of claim 11, comprising:
applying a negative voltage to the cathode electrode relative to the at least one anode electrode; and
detecting current from the radiation sensor by the signal processing unit, wherein dark current increases by less than 50% during operation in a temperature range between 300 degrees Kelvin and 335 degrees Kelvin.

13. The radiation sensor of claim 1, wherein the potential-barrier layer has a thickness in a range from 1 nm to 300 nm.

14. A method of operating a radiation detector which comprises:
a radiation sensor comprising a radiation-sensitive semiconductor layer which comprises n-type cadmium zinc telluride, a cathode electrode disposed over a front side of the radiation-sensitive semiconductor layer that is configured to be exposed to radiation, at least one anode electrode disposed over a backside of the radiation-sensitive semiconductor layer, and a potential-barrier layer located between the cathode electrode and the front side of the radiation-sensitive semiconductor layer; and
a signal processing unit including at least one pixel detector circuit that is electrically connected to the at least one anode electrode,
the method comprising:
applying a negative voltage to the cathode electrode relative to the at least one anode electrode; and
detecting current from the radiation sensor by the signal processing unit, wherein dark current increases by less than 50% during operation in a temperature range between 300 degrees Kelvin and 335 degrees Kelvin.

* * * * *